US010784438B2

(12) United States Patent
Inubushi et al.

(10) Patent No.: US 10,784,438 B2
(45) Date of Patent: Sep. 22, 2020

(54) MAGNETORESISTIVE EFFECT ELEMENT

(71) Applicant: TDK CORPORATION, Tokyo (JP)

(72) Inventors: Kazuumi Inubushi, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/209,533

(22) Filed: Dec. 4, 2018

(65) Prior Publication Data

US 2019/0173000 A1  Jun. 6, 2019

(30) Foreign Application Priority Data

Dec. 5, 2017 (JP) .................. 2017-233302

(51) Int. Cl.
| | | |
|---|---|---|
| *H01L 29/82* | (2006.01) | |
| *H01L 43/02* | (2006.01) | |
| *H01L 43/12* | (2006.01) | |
| *H01L 43/10* | (2006.01) | |
| *H01L 43/08* | (2006.01) | |

(52) U.S. Cl.
CPC ............. *H01L 43/02* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12
USPC ........................................................ 257/421
See application file for complete search history.

(56) References Cited

U.S. PATENT DOCUMENTS

| | | | | |
|---|---|---|---|---|
| 6,954,341 | B2 * | 10/2005 | Kamata ................. | B82Y 10/00 360/322 |
| 8,982,514 | B2 * | 3/2015 | Nagasawa ............... | H01L 43/08 360/324.2 |
| 9,589,583 | B1 * | 3/2017 | Du ........................ | H01L 43/08 |
| 2005/0111147 | A1 * | 5/2005 | Hiramoto ............... | H01L 43/10 360/324.11 |
| 2016/0019917 | A1 | 1/2016 | Du et al. | |
| 2017/0229643 | A1 | 8/2017 | Chen et al. | |
| 2018/0226573 | A1 | 8/2018 | Chen et al. | |

FOREIGN PATENT DOCUMENTS

| | | | |
|---|---|---|---|
| JP | 2008-4842 | * | 1/2008 |
| JP | 2012-190914 A | | 10/2012 |
| JP | 6137577 B2 | | 5/2017 |
| JP | 2017-103419 A | | 6/2017 |

OTHER PUBLICATIONS

Z. H. Yuan et al., "Double-pinned magnetic tunnel junction sensors with spin-valve-like sensing layers", Journal of Applied Physics, 2015, vol. 118, pp. 053904-1 to 053904-4.

* cited by examiner

*Primary Examiner* — Tan N Tran
(74) *Attorney, Agent, or Firm* — Oliff PLC

(57) ABSTRACT

A magnetoresistive effect element according to one aspect of the present disclosure includes a first ferromagnetic layer, a second ferromagnetic layer, and a spacer layer. The spacer layer is provided between the first ferromagnetic layer and the second ferromagnetic layer. The spacer layer includes an Mn alloy represented by General Formula (1).

$$Mn_\gamma X_{1-\gamma} \qquad (1)$$

(in the Formula, X is at least one metal selected from the group consisting of Al, V, Cr, Cu, Zn, Ag, Au, an NiAl alloy, an AgMg alloy, and an AgZn alloy, and γ is 0<γ<0.5.)

8 Claims, 8 Drawing Sheets

Fig.2

| MATERIAL | RATIO OF Mn | CRYSTAL STRUCTURE ||||| LATTICE SPACING (nm) |||
|---|---|---|---|---|---|---|---|---|
| | | Structure type | Pearson symbol | Space group | No. | a | 2a | a√2 |
| Ag (REFERENCE) | | Cu | cF4 | Fm-3m | 225 | 0.4100 | | 0.5798(*) |
| $Mn_{0.06}Al_{0.94}$ | 0.06 | Cu | cF4 | Fm-3m | 225 | 0.4025 | 0.8050 | 0.5692(*) |
| VMn | 0.5 | CsCl | cP2 | Pm-3m | 221 | 0.2900 | 0.5800(*) | 0.4101 |
| $Cr_{0.5}Mn_{0.5}$ | 0.5 | W | cI2 | Im-3m | 229 | 0.2907 | 0.5814(*) | 0.4111 |
| $Cu_{0.5}Mn_{0.5}$ | 0.5 | Cu | cF4 | Fm-3m | 225 | 0.3700 | 0.7400 | 0.5233(*) |
| $Zn_{2.92}Mn_{1.08}$ | 0.27 | $Cu_3Au$ | cP4 | Pm-3m | 221 | 0.3860 | 0.7720 | 0.5459(*) |
| $Ag_{0.84}Mn_{0.16}$ | 0.16 | Cu | cF4 | Fm-3m | 225 | 0.4085 | 0.8171 | 0.5778(*) |
| $Au_{0.81}Mn_{0.19}$ | 0.19 | Cu | cF4 | Fm-3m | 225 | 0.4059 | 0.8118 | 0.5740(*) |
| $Mn_{0.5}Ni_{0.5}Al_{1.0}$ | 0.25 | CsCl | cP2 | Pm-3m | 221 | 0.2930 | 0.5860(*) | 0.4144 |

Fig. 3

| MATERIAL | Co$_2$MnSi | Co$_2$MnGe | Co$_2$MnGa | Co$_2$FeGa | Co$_2$FeSi | Co$_2$MnSn | Co$_2$MnAl | Co$_2$FeAl |
|---|---|---|---|---|---|---|---|---|
| Ag (REFERENCE) | 0.5606 | 0.5711 | 0.5770 | 0.5677 | 0.5658 | 0.5982 | 0.5664 | 0.5730 |
| Mn$_{0.06}$Al$_{0.94}$ | 3.4% | 1.5% | 0.5% | 2.1% | 2.5% | -3.1% | 2.4% | 1.2% |
| VMn | 1.5% | -0.3% | -1.3% | 0.3% | 0.6% | -4.8% | 0.5% | -0.7% |
| Cr$_{0.5}$Mn$_{0.5}$ | 3.5% | 1.6% | 0.5% | 2.2% | 2.5% | -3.0% | 2.4% | 1.2% |
| Cu$_{0.5}$Mn$_{0.5}$ | 3.7% | 1.8% | 0.8% | 2.4% | 2.8% | -2.8% | 2.6% | 1.5% |
| Zn$_{2.92}$Mn$_{1.08}$ | -6.7% | -8.4% | -9.3% | -7.8% | -7.5% | -12.5% | -7.6% | -8.7% |
| Ag$_{0.84}$Mn$_{0.16}$ | -2.6% | -4.4% | -5.4% | -3.8% | -3.5% | -8.7% | -3.6% | -4.7% |
| Au$_{0.81}$Mn$_{0.19}$ | 3.1% | 1.2% | 0.1% | 1.8% | 2.1% | -3.4% | 2.0% | 0.8% |
| Mn$_{0.5}$Ni$_{0.5}$Al$_{1.0}$ | 2.4% | 0.5% | -0.5% | 1.1% | 1.5% | -4.0% | 1.3% | 0.2% |
|  | 4.5% | 2.6% | 1.6% | 3.2% | 3.6% | -2.0% | 3.5% | 2.3% |

Fig.4

| MATERIAL | Co$_2$CrAl | Co$_2$VAl | Co$_2$MnGa$_{0.5}$Sn$_{0.5}$ | Co$_2$FeGeGa |
|---|---|---|---|---|
| | 0.5890 | 0.5800 | 0.5870 | 0.5740 |
| Ag (REFERENCE) | −1.6% | 0.0% | −1.2% | 1.0% |
| Mn$_{0.06}$Al$_{0.94}$ | −3.4% | −1.9% | −3.0% | −0.8% |
| VMn | −1.5% | 0.0% | −1.2% | 1.0% |
| Cr$_{0.5}$Mn$_{0.5}$ | −1.3% | 0.2% | −1.0% | 1.3% |
| Cu$_{0.5}$Mn$_{0.5}$ | −11.2% | −9.8% | −10.9% | −8.8% |
| Zn$_{2.92}$Mn$_{1.08}$ | −7.3% | −5.9% | −7.0% | −4.9% |
| Ag$_{0.84}$Mn$_{0.16}$ | −1.9% | −0.4% | −1.6% | 0.7% |
| Au$_{0.81}$Mn$_{0.19}$ | −2.5% | −1.0% | −2.2% | 0.0% |
| Mn$_{0.5}$Ni$_{0.5}$Al$_{1.0}$ | −0.5% | 1.0% | −0.2% | 2.1% |

Fig.6

| MATERIAL | 0 | 0.02 | 0.05 | 0.1 | 0.2 | γ 0.3 | 0.4 | 0.5 | 0.6 | 0.7 |
|---|---|---|---|---|---|---|---|---|---|---|
| $Mn_\gamma Al_{1-\gamma}$ | <1592 | 9,330 | 11,457 | 16,744 | 15,590 | 12,459 | 10,762 | 1,194 | | |
| $Mn_\gamma V_{1-\gamma}$ | <1592 | 8,356 | 10,345 | 15,916 | 16,712 | 13,927 | 9,550 | 1,194 | | |
| $Mn_\gamma Cr_{1-\gamma}$ | <1592 | 9,550 | 13,927 | 21,089 | 22,282 | 15,916 | 8,356 | 1,592 | | |
| $Mn_\gamma Cu_{1-\gamma}$ | <1592 | 11,937 | 15,518 | 23,874 | 23,476 | 12,733 | 8,356 | 3,581 | MR CURVE CANNOT BE OBSERVED | |
| $Mn_\gamma Zn_{1-\gamma}$ | <1592 | 9,550 | 13,131 | 23,078 | 21,089 | 16,314 | 11,141 | 2,387 | | |
| $Mn_\gamma Ag_{1-\gamma}$ | <1592 | 11,937 | 15,916 | 24,670 | 27,057 | 23,078 | 11,937 | 2,387 | | |
| $Mn_\gamma Au_{1-\gamma}$ | <1592 | 8,754 | 11,937 | 19,895 | 25,068 | 15,916 | 9,550 | 1,592 | | |
| $Mn_\gamma (NiAl)_{1-\gamma}$ | <1592 | 10,572 | 14,552 | 21,220 | 19,872 | 16,428 | 8,356 | 1,592 | | |
| $Mn_\gamma (Ag_3Mg)_{1-\gamma}$ | <1592 | 12,044 | 16,321 | 22,561 | 21,455 | 17,465 | 9,550 | 1,592 | | |
| $Mn_\gamma (AgZn)_{1-\gamma}$ | <1592 | 11,937 | 13,131 | 23,888 | 23,009 | 14,228 | 8,356 | 1,592 | | |

MAGNETORESISTIVE EFFECT ELEMENT

TECHNICAL FIELD

One aspect of the present disclosure relates to a magnetoresistive effect element.

BACKGROUND

Japanese Unexamined Patent Publication No. 2012-190914 discloses a magnetoresistive effect element including a first half-metal ferromagnetic layer, a second half-metal ferromagnetic layer, and a nonmagnetic metal layer (spacer layer) interposed between the first half-metal ferromagnetic layer and the second half-metal ferromagnetic layer. In this magnetoresistive effect element, at least one of the first half-metal ferromagnetic layer and the second half-metal ferromagnetic layer is made of a Heusler alloy, so that the magnetoresistive effect element exhibits a high MR ratio.

The non-patent literature (Z. H. Yuan, "Double-pinned magnetic tunnel junction sensors with spin-valve-like sensing layers", JOURNAL OF APPLIED PHYSICS 118, 053904, US, 2015) discloses a magnetic tunnel junction (MTJ) sensor configured by using a magnesium oxide (MgO) for an insulator layer.

In the magnetoresistive effect element described in Japanese Unexamined Patent Publication No. 2012-190914, since the change in the resistance value between the magnetization parallel state and the magnetization antiparallel state is steep, the resistance value is approximately binary. Therefore, this magnetoresistive effect element is not suitable for a sensor requiring an analog output.

In the sensor described in Z. H. Yuan, the range (dynamic range) where the resistance changes with respect to the external magnetic field is narrow, and the application is limited.

SUMMARY

One aspect of the present disclosure has been made in view of the above-described problems and is to provide a magnetoresistive effect element having a wide dynamic range.

A magnetoresistive effect element according to one aspect of the present disclosure includes a first ferromagnetic layer, a second ferromagnetic layer, and a spacer layer. The spacer layer is provided between the first ferromagnetic layer and the second ferromagnetic layer. The spacer layer includes an Mn alloy represented by General Formula (1).

$$Mn_\gamma X_{1-\gamma} \quad (1)$$

(in the Formula, X is at least one metal selected from the group consisting of Al, V, Cr, Cu, Zn, Ag, Au, an NiAl alloy, an AgMg alloy, and an AgZn alloy, and $\gamma$ is $0<\gamma<0.5$.)

In the magnetoresistive effect element, the relative angle between the magnetization direction of the first ferromagnetic layer and the magnetization direction of the second ferromagnetic layer can be gently changed with respect to the external magnetic field. As a result, the change of the resistance with respect to the external magnetic field becomes gentle. Therefore, the dynamic range can be widened.

At least one of the first ferromagnetic layer and the second ferromagnetic layer may contain a Heusler alloy. In this case, the MR ratio is increased.

The Heusler alloy may contain at least Mn. In this case, at least one of the first ferromagnetic layer and the second ferromagnetic layer contains Mn. As a result, the probability of existence of Mn in the spacer layer is further increased as compared with a case where Mn is not contained in the first ferromagnetic layer and the second ferromagnetic layer. Therefore, the magnetic coupling between the first ferromagnetic layer and the second ferromagnetic layer is further enhanced through the Mn in the spacer layer. As a result, the change of the resistance with respect to the external magnetic field becomes gentler. Therefore, the dynamic range can be further widened.

The Heusler alloy may be represented by General Formula (2). In this case, the MR ratio at room temperature is increased since the Co-based Heusler alloy has a high Curie temperature.

$$Co_2MnZ \quad (2)$$

(in the Formula, Z is at least one element selected from the group consisting of Fe, Si, Al, Ga, Ge, and Sn.)

In General Formula (1), $\gamma$ may be $0.02<\gamma<0.4$. In this case, the dynamic range can be widened in particular.

A magnetoresistive effect element according to one aspect of the present disclosure includes a first ferromagnetic layer, a second ferromagnetic layer, and a spacer layer. The spacer layer is provided between the first ferromagnetic layer and the second ferromagnetic layer. A resistance exhibits an increasing tendency or a decreasing tendency with respect to an external magnetic field in a continuous region where a range of the external magnetic field extends over 8000 A/m or more.

In the magnetoresistive effect element, in the continuous region where the range of the external magnetic field extends over 8000 A/m or more, the resistance value can be gently changed with respect to the external magnetic field. Therefore, the dynamic range can be widened.

BRIEF DESCRIPTION OF THE DRAWINGS

FIG. 2 is a table showing a ratio of Mn, a crystal structure, and a lattice spacing for an example of an Mn alloy represented by General Formula (1).

FIG. 3 is a table showing a lattice mismatch rate between the example of the Mn alloy shown in FIG. 2 and an example of a Heusler alloy represented by General Formula (2).

FIG. 4 is a table showing the lattice mismatch rate between the example of the Mn alloy shown in FIG. 2 and the example of the Heusler alloy represented by General Formula (2).

FIG. 6 is a table showing a relationship between a spacer layer and a dynamic range of a magnetoresistive effect element according to Example 2.

DETAILED DESCRIPTION

Figure 1:
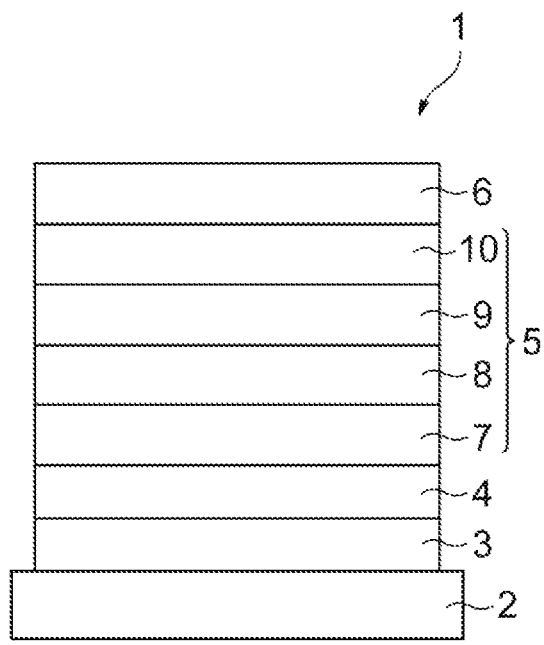
FIG. 1 is a diagram illustrating a cross section of a magnetoresistive effect element according to an embodiment.

Hereinafter, embodiments of the present disclosure will be described in detail with reference to the accompanying drawings. In the description, the same reference numerals are used for the same elements or elements having the same function, and redundant description is omitted. Dimensional ratios in constituent elements and between constituent elements in the drawings are arbitrary, respectively, for ease of viewing of the drawings.

FIG. 1 is a diagram illustrating a cross section of a magnetoresistive effect element according to an embodiment. As illustrated in FIG. 1, a magnetoresistive effect element 1 according to the embodiment includes a substrate 2, a crystal alignment layer 3, an under layer 4, a magnetoresistive layer 5, and a cap layer 6 in this order. The magnetoresistive layer 5 includes a first ferromagnetic layer 7 as a magnetization free layer, a spacer layer 8, a second ferromagnetic layer 9 as a magnetization fixed layer, and an antiferromagnetic layer 10 in this order from the under layer 4 side.

The magnetoresistive effect element 1 is produced by stacking the layers including the crystal alignment layer 3 to the cap layer 6 on the substrate 2 by a manufacturing method such as a sputtering method or an evaporation method. The magnetoresistive effect element 1 is a magnetoresistive effect element having a current-perpendicular-to-plane (CPP) structure in which a detection current flows along the stacking direction (the direction perpendicular to the film surface of each layer).

The substrate 2 contains, for example, a metal oxide single crystal, a silicon single crystal, a silicon single crystal with a thermal oxide film, a sapphire single crystal, a ceramic, a quartz, or a glass. The material contained in the substrate 2 is not particularly limited as long as the material has an appropriate mechanical strength and is suitable for heat treatment or fine processing. As the metal oxide single crystal, for example, an MgO single crystal can be exemplified. According to a substrate containing an MgO single crystal, an epitaxial growth film is easily formed. This epitaxial growth film can exhibit large magnetoresistive characteristics. The thickness of the substrate 2 is, for example, 0.1 mm or more and 2 mm or less.

The crystal alignment layer 3 is provided between the under layer 4 and the substrate 2. The crystal alignment layer 3 is provided so as to control the crystal alignment of the upper layer together with the under layer 4. For the crystal alignment layer 3, for example, Cr can be used. In addition, the crystal alignment layer 3 may contain at least one of, for example, Ag, Au, Cu, V, Al, W, and Pt as a metal element for controlling the crystal alignment of the upper layer. The crystal alignment layer 3 may contain an alloy of these metal elements or a laminate of materials including two or more of these metal elements. The alloys of the metal elements also include, for example, a cubic AgZn alloy, a cubic AgMg alloy, a cubic NiAl alloy, and the like. The thickness of the crystal alignment layer 3 is, for example, 10 nm or more and 30 nm or less. The crystal alignment layer 3 is provided as necessary. The crystal alignment layer may not necessarily be provided.

The under layer 4 is provided between the crystal alignment layer 3 and the first ferromagnetic layer 7. The under layer 4 can be an electrode for flowing a detection current. The under layer 4 contains at least one metal element of, for example, Ag, Au, Cu, Cr, V, Al, W, and Pt. The under layer 4 may contain an alloy of these metal elements or a laminate of materials including two or more of these metal elements. The alloys of the metal elements include, for example, a cubic AgZn alloy, a cubic AgMg alloy or a cubic NiAl alloy. The thickness of the under layer 4 is, for example, 20 nm or more and 100 nm or less.

The first ferromagnetic layer 7 is provided between the under layer 4 and the spacer layer 8. The first ferromagnetic layer 7 functions as a magnetization free layer. The magnetization direction of the first ferromagnetic layer 7 is not substantially fixed. Therefore, when an external magnetic field is applied to the measurement object, the magnetization direction is easily changed in that direction. The thickness of the first ferromagnetic layer 7 is, for example, 1 nm or more and 20 nm or less.

The spacer layer 8 is provided between the first ferromagnetic layer 7 and the second ferromagnetic layer 9. The spacer layer 8 is a nonmagnetic layer containing an Mn alloy represented by General Formula (1).

$$Mn_\gamma X_{1-\gamma} \tag{1}$$

In General Formula (1), X is at least one metal selected from the group consisting of Al, V, Cr, Cu, Zn, Ag, Au, an NiAl alloy, an AgMg alloy, and an AgZn alloy, and γ is 0<γ<0.5. In widening the dynamic range, γ is more preferably 0.02<γ<0.4, and still more preferably 0.05<γ<0.3. The thickness of the spacer layer 8 is, for example, 2 nm or more and 10 nm or less.

The second ferromagnetic layer 9 is provided between the spacer layer 8 and the antiferromagnetic layer 10. The second ferromagnetic layer 9 functions as a magnetization fixed layer. The magnetization direction of the second ferromagnetic layer 9 is harder to change than the magnetization direction of the first ferromagnetic layer 7 with respect to an external magnetic field. Preferably, the magnetization direction of the second ferromagnetic layer 9 is substantially fixed with respect to the external magnetic field of the measurement object and is not changed. The thickness of the second ferromagnetic layer 9 is, for example, 1 nm or more and 20 nm or less. The thickness of the second ferromagnetic layer 9 is, for example, equivalent to the thickness of the first ferromagnetic layer 7.

The antiferromagnetic layer 10 is provided between the second ferromagnetic layer 9 and the cap layer 6. The antiferromagnetic layer 10 is provided on the surface of the second ferromagnetic layer 9 opposite to the spacer layer 8 side. The antiferromagnetic layer 10 exchange-couples to the second ferromagnetic layer 9 and imparts uniaxial magnetic anisotropy to the second ferromagnetic layer 9, so that the antiferromagnetic layer 10 is used for substantially fixing the magnetization direction of the second ferromagnetic layer 9.

As the material of the antiferromagnetic layer 10, for example, an FeMn alloy, a PtMn alloy, a PtCrMn alloy, an NiMn alloy, an IrMn alloy, NiO, and $Fe_2O_3$ may be exemplified. The thickness of the antiferromagnetic layer 10 is, for example, 5 nm or more and 15 nm or less. When the coercive force of the second ferromagnetic layer 9 is larger than the coercive force of the first ferromagnetic layer 7 and has such a magnitude that the magnetization direction of the second ferromagnetic layer 9 is substantially fixed with respect to the external magnetic field of the measurement object according to a method of changing the thicknesses of the first ferromagnetic layer 7 and the second ferromagnetic layer 9, the antiferromagnetic layer 10 may not necessarily be provided.

The external magnetic field is applied to the magnetoresistive layer 5, and thus, a relative angle between the magnetization direction of the first ferromagnetic layer 7 and the magnetization direction of the second ferromagnetic layer 9 (hereinafter, also simply referred to as a "relative angle") is changed. Therefore, in the magnetoresistive layer 5, the magnetoresistance is changed and the magnetoresistive effect is exhibited. The relative angle and the magnetoresistance are in a proportional relation. The magnetoresistive layer 5 takes any of a magnetization parallel state, a magnetization antiparallel state, and a transition state according to the external magnetic field. The magnetization parallel state is a state where the magnetization direction of the first ferromagnetic layer 7 and the magnetization direction of the second ferromagnetic layer 9 are parallel. The magnetization antiparallel state is a state where the magnetization direction of the first ferromagnetic layer 7 and the magnetization direction of the second ferromagnetic layer 9 are antiparallel. The transition state is a state where the first ferromagnetic layer 7 and the second ferromagnetic layer 9 are between the magnetization parallel state and the magnetization antiparallel state. The relative angle is 0 degree in the magnetization parallel state, 180 degrees in the magnetization antiparallel state, and an angle between 0 degree and 180 degrees in the transition state. The resistance of the magnetoresistive effect element 1 takes a minimum value in the magnetization parallel state, a maximum value in the magnetization antiparallel state, and a value between the minimum value and the maximum value in the transition state.

In the magnetoresistive layer 5, since one of the first ferromagnetic layer 7 and the second ferromagnetic layer 9 is a magnetization free layer and the other is a magnetization fixed layer, the first ferromagnetic layer 7 may be a magnetization fixed layer, and the second ferromagnetic layer 9 may be a magnetization free layer. In this case, the antiferromagnetic layer 10 is provided on the surface of the first ferromagnetic layer 7 opposite to the spacer layer 8 side.

At least one of the first ferromagnetic layer 7 and the second ferromagnetic layer 9 contains a Heusler alloy. The Heusler alloy contains at least Mn and is represented by General Formula (2).

$$Co_2MnZ \qquad (2)$$

In General Formula (2), Z is at least one element selected from the group consisting of Fe, Si, Al, Ga, Ge, and Sn. At least one of the first ferromagnetic layer 7 and the second ferromagnetic layer 9 may preferably be substantially made of the Heusler alloy.

The first ferromagnetic layer 7 and the second ferromagnetic layer 9 may contain a Heusler alloy other than General Formula (2) such as $Co_2FeSi$, $Co_2FeGaGe$, or $Co_2FeAl$, or a ferromagnetic material such as $Fe_3O_4$, $CrO_2$, or CoFeB. The first ferromagnetic layer 7 and the second ferromagnetic layer 9 may be substantially made of the ferromagnetic material.

The cap layer 6 is provided so as to protect the magnetoresistive layer 5. The cap layer 6 may contain, for example, one or more metal elements of Ru, Ag, Al, Cu, Au, Cr, Mo, Pt, W, Ta, Pd, and Ir, an alloy of these metal elements, or a stack of materials including two or more of these metal elements.

In the manufacturing process of the magnetoresistive effect element 1, heat treatment is performed as necessary. If necessary, a magnetic field applying process is performed, so that magnetic anisotropy such as uniaxial magnetic anisotropy is imparted to at least one of the first ferromagnetic layer 7 and the second ferromagnetic layer 9. The magnetic field applying process may be performed together with the heat treatment.

FIG. 2 is a table showing a ratio of Mn, a crystal structure and a lattice spacing for an example of the Mn alloy represented by General Formula (1). As shown in FIG. 2, the Mn alloy represented by General Formula (1) can take a cubic system. In the space group shown in FIG. 2, "Fm-3m" represents a face centered cubic (fcc), "Pm-3m" represents a simple lattice, and "Im-3m" represents a body centered cubic (bcc).

FIGS. 3 and 4 are tables showing a lattice mismatch rate between an example of the Mn alloy shown in FIG. 2 and the example of the Heusler alloy represented by General Formula (2). In the calculation of the lattice mismatch rate, the values attached with (*) in FIG. 2 are used as the lattice spacing of the Mn alloy. As shown in FIGS. 3 and 4, in the example of the Mn alloy shown in FIG. 2, the lattice mismatch rate with respect to the example of the Heusler alloy represented by General Formula (2) is small, and the lattice matching property is high.

Since the above-described magnetoresistive effect element 1 includes the spacer layer 8 containing the Mn alloy represented by General Formula (1), the relative angle and the magnetoresistance can be gently changed with respect to the external magnetic field. The relative angle and the magnetoresistance exhibits an increasing tendency or a decreasing tendency with respect to the external magnetic field in a continuous region where the range of the external magnetic field extends over 8000 A/m or more. As a result, the change of the resistance with respect to the external magnetic field becomes gentle. Therefore, it is possible to widen the region (dynamic range) where the resistance changes with respect to the external magnetic field, specifically the region exhibiting the increasing tendency or the decreasing tendency.

Since at least one of the first ferromagnetic layer 7 and the second ferromagnetic layer 9 contains the Heusler alloy, the MR ratio is increased. Since the Heusler alloy contains Mn, the probability of existence of Mn in the spacer layer 8 is further increased as compared with a case where Mn is not contained in the first ferromagnetic layer 7 and the second ferromagnetic layer 9. Therefore, the magnetic coupling between the first ferromagnetic layer 7 and the second ferromagnetic layer 9 is further enhanced through the Mn in the spacer layer 8. As a result, the change of the resistance with respect to the external magnetic field becomes gentler. Therefore, the dynamic range can be further widened. In addition, since the Heusler alloy is a Co-based Heusler alloy represented by General Formula (2), the Curie temperature is high, and the MR ratio at room temperature is increased. In General Formula (1), γ may be 0.02<γ<0.4. In this case, the dynamic range can be particularly widened.

Heretofore, although the embodiments of the present disclosure have been described, the present disclosure is not necessarily limited to the above-described embodiments, and various modifications are possible without departing from the spirit of the disclosure.

EXAMPLES

The effects of the magnetoresistive effect element 1 will be more specifically described by using Examples and Comparative Examples.

Example 1

As a magnetoresistive effect element according to Example 1, a magnetoresistive effect element corresponding to the magnetoresistive effect element 1 according to the above embodiment was produced. An MgO single crystal having a thickness of 0.5 mm was used as the substrate. Cr was used for the alignment control layer, and the thickness was set to 20 nm. Ag was used for the under layer, and the thickness was set to 50 nm. Co$_2$MnSi was used for the first ferromagnetic layer, and the thickness was set to 4 nm. Mn$_{0.1}$Ag$_{0.9}$ was used for the spacer layer, and the thickness was set to 5 nm. Co$_2$MnSi was used for the second ferromagnetic layer, and the thickness was set to 4 nm. IrMn was used for the antiferromagnetic layer, and the thickness was set to 10 nm. Ru was used for the cap layer, and the thickness was set to 5 nm. Each layer on the substrate was produced by a sputtering method. After the layers were formed on the substrate, heat treatment in a magnetic field was performed to impart uniaxial magnetic anisotropy to the first ferromagnetic layer and the second ferromagnetic layer. The heat treatment temperature in the heat treatment in the magnetic field was set to 300° C., and the intensity of the applied magnetic field was set to 5 kOe (399 kA/m).

Figure 5:
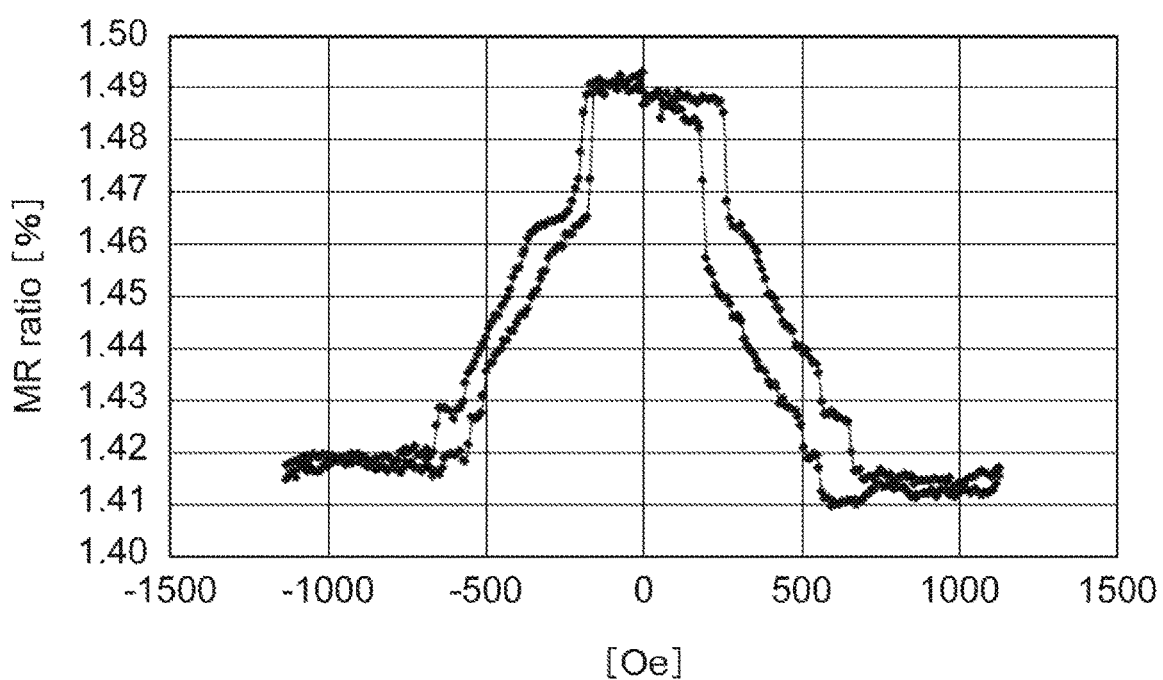
FIG. 5 is a graph showing an MR curve of a magnetoresistive effect element according to Example 1.

FIG. 5 is a graph showing an MR curve of the magnetoresistive effect element according to Example 1. The horizontal axis represents the external magnetic field, and the vertical axis represents the MR ratio. As shown in FIG. 5, in the magnetoresistive effect element according to Example 1, the MR ratio exhibits an increasing tendency or a decreasing tendency with respect to the external magnetic field in a continuous region where the range of the external magnetic field extends over 8000 A/m or more.

The region where the MR ratio exhibits an increasing tendency or a decreasing tendency with respect to the external magnetic field as described above is a region corresponding to the transition state described above. The region where the MR ratio exhibits an increasing tendency with respect to the external magnetic field is a region in the transition state, particularly, a region corresponding to an intermediate state where the magnetization directions of the first ferromagnetic layer and the second ferromagnetic layer are changed from the magnetization parallel state to the magnetization antiparallel state. The region where the MR ratio exhibits a decreasing tendency with respect to the external magnetic field is a region in the transition state, particularly, a region corresponding to an intermediate state where the magnetization directions of the first ferromagnetic layer and the second ferromagnetic layer are changed from the magnetization antiparallel state to the magnetization parallel state. Therefore, in the magnetoresistive effect element according to Example 1, it can be said that, in the continuous region in which the range of the external magnetic field extends over 8000 A/m or more, the first ferromagnetic layer and the second ferromagnetic layer are in a state between the magnetization parallel state and the magnetization antiparallel state. More specifically, it can be said that the first ferromagnetic layer and the second ferromagnetic layer are in the intermediate state where the magnetization directions of the first ferromagnetic layer and the second ferromagnetic layer are changed from the magnetization parallel state to the magnetization antiparallel state or in the intermediate state where the magnetization directions of the first ferromagnetic layer and the second ferromagnetic layer are changed from the magnetization antiparallel state to the magnetization parallel state.

In the MR curve, when the minimum value of the MR ratio is set to 0% and the maximum value is set to 100%, by taking the measurement error into consideration, a region where the MR ratio is 0 to 10% may be treated as the region corresponding to the magnetization parallel state, a region where the MR ratio is 10 to 90% may be treated as the region corresponding to the transition state, and a region where the MR ratio is 90 to 100% may be treated as the region corresponding to the magnetization antiparallel state. That is, the region where the MR ratio exhibits an increasing tendency may be treated as the region where the MR ratio reaches from 10% to 90%, and the region where the MR ratio exhibits a decreasing tendency may be treated as the region where the MR ratio reaches from 90% to 10%. Therefore, in the magnetoresistive effect element according to Example 1, it can be said that, in the MR curve, the range of the external magnetic field is 8000 A/m or more in the region where the MR ratio reaches from 10% to 90% or in the region where the MR ratio reaches from 90% to 10%. In this case, the absolute value of the slope of the MR curve in the region corresponding to the transition state is 0.01% m/A (=80%/8000 A/m) or less. The absolute value of the slope is more preferably 0.008% m/A (=80%/10000 A/m) or less.

As described above, in the magnetoresistive effect element according to Example 1, the region (dynamic range) where the resistance value is changed with respect to the external magnetic field, specifically, the region exhibiting an increasing tendency or a decreasing tendency has 8000 A/m or more. Therefore, the magnetoresistive effect element can be suitably used for a sensor requiring an analog output.

Example 2

A magnetoresistive effect element according to Example 2 was produced in the same manner as in Example 1 except that the spacer layer was changed. Concretely, the spacer layer is configured with Mn$_\gamma$Al$_{1-\gamma}$, Mn$_\gamma$V$_{1-\gamma}$, Mn$_\gamma$Cr$_{1-\gamma}$, Mn$_\gamma$Cu$_{1-\gamma}$, Mn$_\gamma$Zn$_{1-\gamma}$, Mn$_\gamma$Ag$_{1-\gamma}$, Mn$_\gamma$Au$_{1-\gamma}$, Mn$_\gamma$(NiAl)$_{1-\gamma}$, Mn$_\gamma$(Ag$_3$Mg)$_{1-\gamma}$, and Mn$_\gamma$(AgZn)$_{1-\gamma}$, and the respective values of γ were changed to 0, 0.02, 0.05, 0.1, 0.2, 0.3, 0.4, 0.5, 0.6, and 0.7. With respect to the magnetoresistive effect elements according to Example 2 manufactured in this manner, the resistance was measured by changing the external magnetic field, and the MR curve was obtained. From the obtained MR curve, the width of the region where the MR ratio exhibits an increasing tendency or a decreasing tendency with respect to the external magnetic field was obtained as the dynamic range. In the magnetoresistive effect elements according to Example 2, the magnetoresistive effect element in which the spacer layer is Mn$_{0.1}$Ag$_{0.9}$ is the same as the magnetoresistive effect element according to Example 1.

Figure 7:
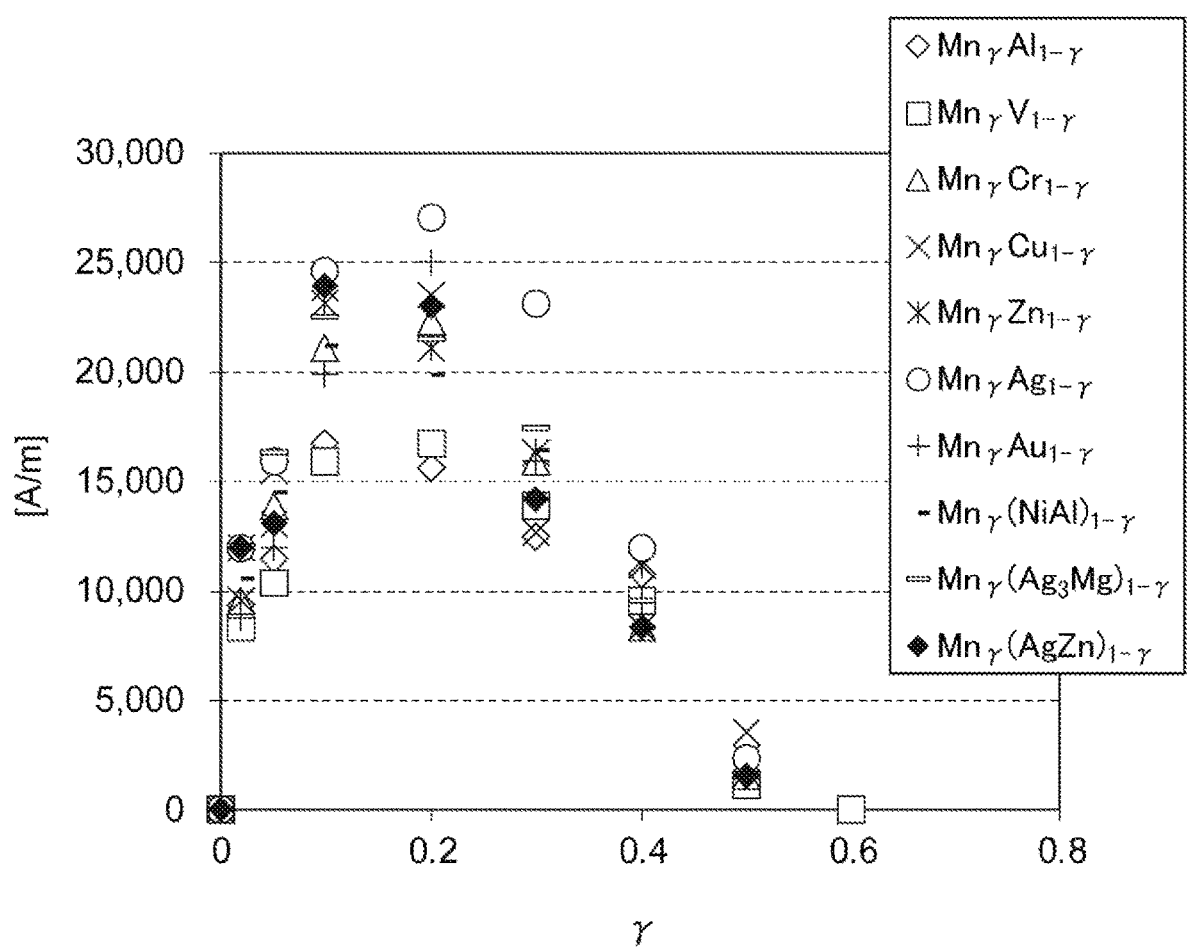
FIG. 7 is a graph showing the relationship between the spacer layer and the dynamic range of the magnetoresistive effect element according to Example 2.

FIG. 6 is a table showing a relationship between the spacer layer and the dynamic range of the magnetoresistive effect element according to Example 2. FIG. 7 is a graph showing the relationship between the spacer layer and the dynamic range of the magnetoresistive effect element according to Example 2. In the case of any of the spacer layers, when γ was 0≤γ≤0.5, it was possible to observe the MR curve, but when γ was 0.6 or more, it was not possible to observe the MR curve. When γ is 0.02≤γ≤0.4, the dynamic range was 8000 A/m or more. When γ is 0.05≤γ≤0.3, the dynamic range was 10000 A/m or more.

Comparative Example

Figure 8:
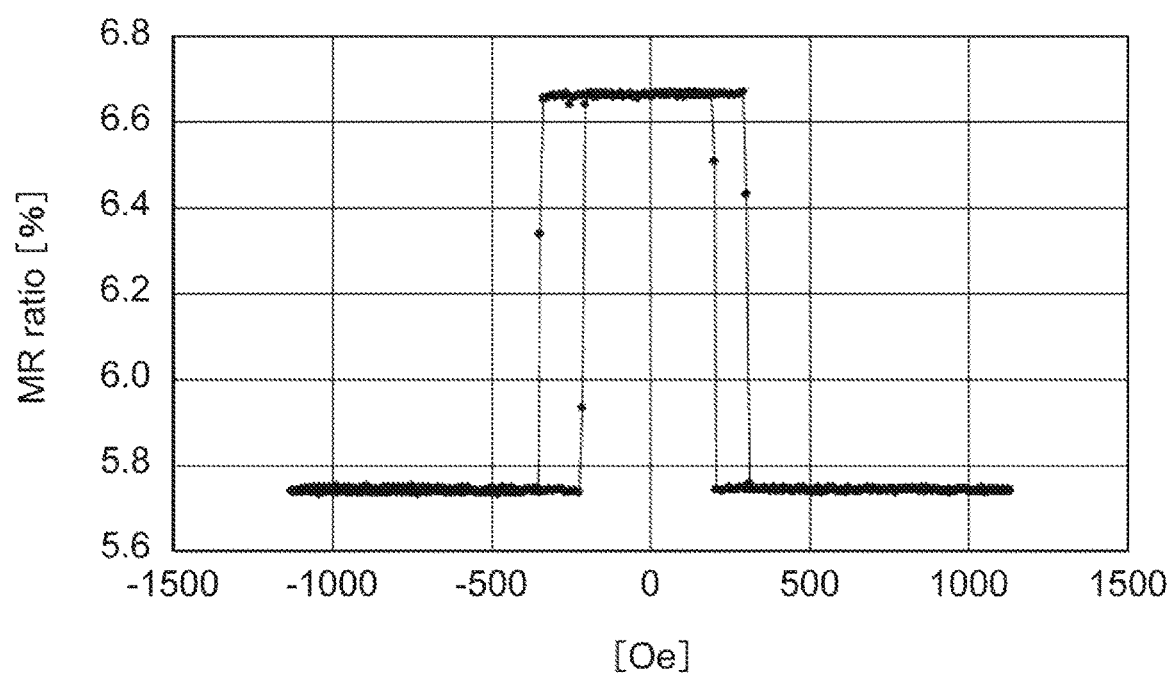
FIG. 8 is a graph showing an MR curve of a magnetoresistive effect element according to Comparative Example.

A magnetoresistive effect element according to Comparative Example was produced in the same manner as in Example 1 except that the material of the spacer layer was Ag. FIG. 8 is a graph showing an MR curve of the magnetoresistive effect element according to Comparative Example. As shown in FIG. 8, in the magnetoresistive effect element according to Comparative Example, since the change in the resistance value between the magnetization parallel state and the magnetization antiparallel state is steep, the resistance value is approximately binary. For this reason, the dynamic range is as narrow as 1500 A/m or less and is not suitable for a sensor requiring an analog output.

What is claimed is:

1. A magnetoresistive effect element comprising:
a first ferromagnetic layer;
a second ferromagnetic layer; and
a spacer layer provided between the first ferromagnetic layer and the second ferromagnetic layer,
wherein the spacer layer contains an Mn alloy represented by General Formula (1):

$$Mn_\gamma X_{1-\gamma} \qquad (1)$$

(in the Formula, X is at least one metal selected from the group consisting of Al, V, Cr, Cu, Zn, Ag, Au, an NiAl alloy, an AgMg alloy, and an AgZn alloy, and γ is 0<γ<0.3).

2. The magnetoresistive effect element according to claim 1, wherein at least one of the first ferromagnetic layer and the second ferromagnetic layer contains a Heusler alloy.

3. The magnetoresistive effect element according to claim 2, wherein the Heusler alloy contains at least Mn.

4. The magnetoresistive effect element according to claim 3, wherein the Heusler alloy is represented by General Formula (2):

$$Co_2MnZ \qquad (2)$$

(in the Formula, Z is at least one element selected from the group consisting of Fe, Si, Al, Ga, Ge, and Sn).

5. The magnetoresistive effect element according to claim 1, wherein γ in General Formula (1) is 0.02<γ<0.3.

6. The magnetoresistive effect element according to claim 1, wherein γ in General Formula (1) is 0.05<γ<0.3.

7. The magnetoresistive effect element according to claim 1, wherein γ in General Formula (1) is 0<γ<0.27.

8. The magnetoresistive effect element according to claim 1, wherein X is at least one metal selected from the group consisting of Al, V, Cu, Zn, Ag, Au, an NiAl alloy, an AgMg alloy, and an AgZn alloy.

* * * * *